(12) United States Patent
Cok

(10) Patent No.: US 6,787,994 B2
(45) Date of Patent: Sep. 7, 2004

(54) OLED AREA ILLUMINATION LIGHT SOURCE HAVING A PLURALITY OF SEGMENTS

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 183 days.

(21) Appl. No.: 10/234,832

(22) Filed: Sep. 4, 2002

(65) Prior Publication Data

US 2004/0042199 A1 Mar. 4, 2004

(51) Int. Cl.[7] .......................... H01J 63/04; F21V 21/00; H01L 29/24
(52) U.S. Cl. ..................... 313/512; 313/500; 313/504; 362/240; 362/800; 362/230; 362/246; 362/247; 257/100
(58) Field of Search .................... 362/84, 249, 800, 362/226, 230–231, 240, 246, 247; 313/500, 504, 512, 318.01, 318.12; 257/97, 100

(56) References Cited

U.S. PATENT DOCUMENTS

| | | | | |
|---|---|---|---|---|
| 4,241,277 A | * | 12/1980 | Hintze et al. ............... | 313/500 |
| 4,626,742 A | * | 12/1986 | Mental ........................ | 313/503 |
| 4,728,999 A | * | 3/1988 | Dannatt et al. ............... | 257/88 |
| 4,769,292 A | | 9/1988 | Tang et al. ................. | 428/690 |
| 5,061,569 A | | 10/1991 | VanSlyke et al. ........... | 428/457 |
| 5,530,269 A | * | 6/1996 | Tang ............................ | 257/88 |
| 5,890,794 A | * | 4/1999 | Abtahi et al. ................ | 362/294 |
| 6,072,450 A | * | 6/2000 | Yamada et al. ............... | 345/76 |
| 6,168,282 B1 | | 1/2001 | Chien ......................... | 362/84 |
| 6,527,400 B2 | * | 3/2003 | Dickie et al. ................. | 362/84 |
| 6,538,375 B1 | * | 3/2003 | Duggal et al. .............. | 313/506 |
| 6,565,231 B1 | * | 5/2003 | Cok ........................... | 362/226 |

FOREIGN PATENT DOCUMENTS

| | | |
|---|---|---|
| EP | 1 120 838 A2 | 8/2001 |
| WO | 99/57945 | 11/1999 |

OTHER PUBLICATIONS

USSN: 10/077,270, filed Feb. 15, 2002 by Liao et al.

* cited by examiner

Primary Examiner—Alan Cariaso
Assistant Examiner—Ali Alavi
(74) Attorney, Agent, or Firm—Thomas H. Close

(57) ABSTRACT

A solid state area illumination light source includes: a substrate; a plurality of non-pixellated organic light emitting diode (OLED) segments deposited on the substrate, each organic light emitting diode segment including a first and a second electrode for providing electrical power to the OLED segment; an encapsulating cover covering the OLED segments; and a plurality of conductors located on the substrate and electrically connected to the first and second electrodes, and extending beyond the encapsulating cover for making electrical contact to the first and second electrodes by an external power source.

26 Claims, 5 Drawing Sheets

OLED AREA ILLUMINATION LIGHT SOURCE HAVING A PLURALITY OF SEGMENTS

FIELD OF THE INVENTION

The present invention relates to the use of organic light emitting diodes for area illumination and more particularly to area illumination light sources having a plurality of segments.

BACKGROUND OF THE INVENTION

Solid-state lighting devices made of light emitting diodes are increasingly useful for applications requiring robustness and long-life. For example, solid-state LEDs are found today in automotive applications. These devices are typically formed by combining multiple, small LED devices providing a point light source into a single module together with glass lenses suitably designed to control the light as is desired for a particular application; see for example WO99/57945, published Nov. 11, 1999. These multiple devices are expensive and complex to manufacture and integrate into single area illumination devices. Moreover, LED devices provide point sources of light, a plurality of which are employed for area illumination.

Organic light emitting diodes (OLEDs) are manufactured by depositing organic semiconductor materials between electrodes on a substrate. This process enables the creation of light sources having extended surface area on a single substrate. The prior art describes the use of electro-luminescent materials as adjuncts to conventional lighting; for example, U.S. Pat. No. 6,168,282, issued Jan. 2, 2001 to Chien. In this case, because of the limited light output from the electro-luminescent material, it is not useful for primary lighting.

EP1120838A2, published Aug. 1, 2001 describes a method for mounting multiple organic light emitting devices on a mounting substrate to create a light source. However, this approach of mounting multiple light sources on a substrate increases the complexity and hence the manufacturing costs of the area illumination light source.

In many lighting applications, it is desirable to have a variety of illumination levels and colors. For example, dimmer switches are well known in conventional lighting to provide variable lighting levels between off and full brightness. It is also desirable to have lighting systems that do not fail catastrophically but instead degrade gracefully. Conventional incandescent light bulbs tend to burn out completely when they fail, providing no light rather than reduced light. In other cases it is useful to have a variety of illumination colors. Since the color of outdoor light changes somewhat from dawn to dusk, it is useful to have a lighting system that can complement or mimic the color of outdoor lighting or provide lighting at a variety of color temperatures. Moreover, there are occasions when specific color temperatures are desired for illumination or when, for decorative or entertainment effect, different colors of illumination light are desired.

There is a need therefore for an improved, solid-state flat-panel area illumination device that avoids the limitations of the prior art.

SUMMARY OF THE INVENTION

The need is met according to the present invention by providing a solid state area illumination light source that includes: a substrate; a plurality of non-pixellated organic light emitting diode (OLED) segments deposited on the substrate, each organic light emitting diode segment including a first and a second electrode for providing electrical power to the OLED segment; an encapsulating cover covering the OLED segments; and a plurality of conductors located on the substrate and electrically connected to the first and second electrodes, and extending beyond the encapsulating cover for making electrical contact to the first and second electrodes by an external power source.

ADVANTAGES

The present invention has the advantage of providing an inexpensive, long lived, highly efficient light source for area illumination that can provide a variety of illumination levels, fails gracefully, and can provide a variety of colors.

It will be understood that the figures are not to scale since the individual layers are too thin and the thickness differences of various layers too great to permit depiction to scale.

DETAILED DESCRIPTION OF THE INVENTION

Figure 1:
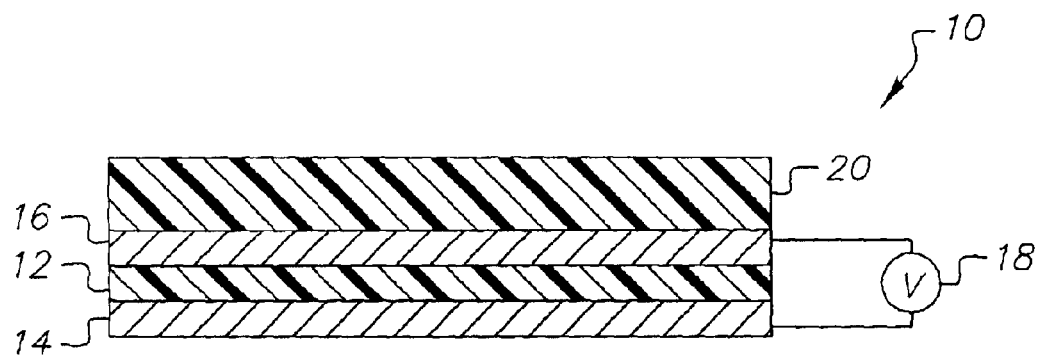
FIG. 1 illustrates a partial cross section of a prior art conventional OLED illumination device.

Referring to FIG. 1, a prior art OLED 10 includes an organic light emitting layer 12 disposed between two electrodes, e.g. a cathode 14 and an anode 16. The organic electro-luminescent layer 12 emits light upon application of a voltage from a power source 18 across the electrodes. The OLED 10 typically includes a substrate 20 such as glass or plastic. It will be understood that the relative locations of the anode 16 and cathode 14 may be reversed with respect to the substrate. The light emitting layer 12 may include other layers such as electron or hole injection layers as is known in the art.

Figure 2:
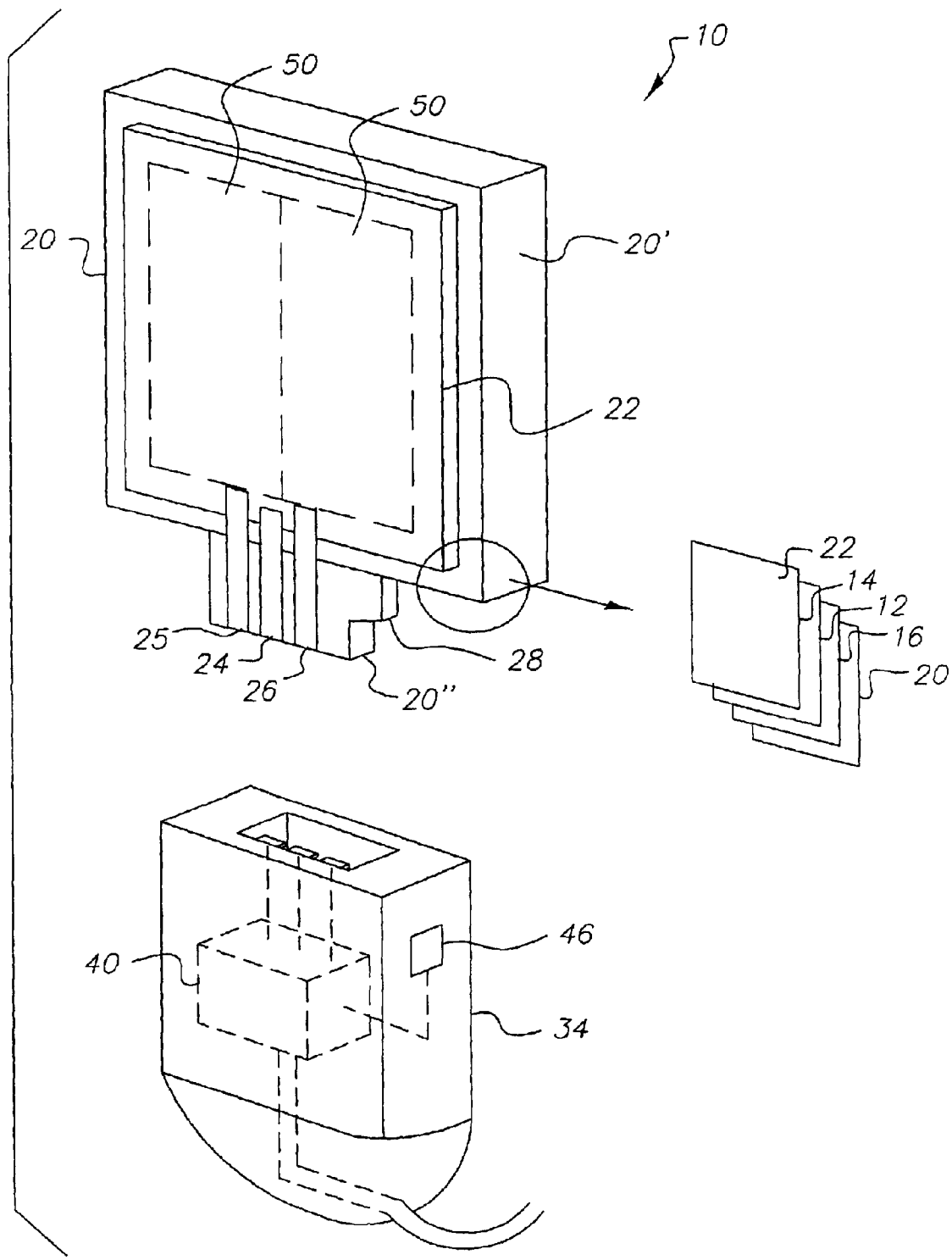
FIG. 2 is a partially broken away perspective view of a light emitting device according to one embodiment of the present invention.

Referring to FIG. 2, according to a preferred embodiment of the present invention, the solid-state area illumination OLED light source 10, includes a transparent substrate 20, the transparent substrate including a body portion 20' and a tab portion 20". A plurality of non-pixellated organic light emitting diode (OLED) segments 50 are located on the body portion 20' of a substrate 20. As used herein the term "non-pixellated" means that the organic light emitting segment 12 is not divided into many small sub-sections or pixels that can be independently activated to form an image. It is contemplated that the number of segments 50 is relatively small (e.g. fewer than 10) for purposes such as providing reliability, adjustable levels of illumination, or adjustable color output.

Each segment 50 includes a light emitting layer 12, a transparent cathode 14 and a transparent anode 16 for providing electrical power to the light emitting layers 12. The anode and/or cathode of the segments may be electrically connected. That is, a single common cathode or anode may be provided that is shared by all of the segments. The other electrode for each segment may be electrically interconnected so that all of the segments can be powered at once, or they may be electrically isolated so that the segments can be selectively powered.

A transparent encapsulating cover 22 is provided over the OLED segments 50 on the body portion 20' of the substrate 20. A plurality of conductors 24, 25, and 26 are located on the tab portion 20" of the substrate 20 and are electrically connected to the anode(s) and cathode(s) 16 and 14 respectively. The conductors extend beyond the cover 22 for providing electrical contact to the anodes and cathode electrodes by an external power source (not shown). In a preferred embodiment of the present invention, the tab portion 20" defines an orientation feature such as step 28 to insure that the illumination source is inserted in a socket 34 in the correct orientation. In applications where it is not required to emit light from both sides of the substrate, one or more of the substrate, cover, anode, or cathode may be opaque or reflective.

Figure 3:
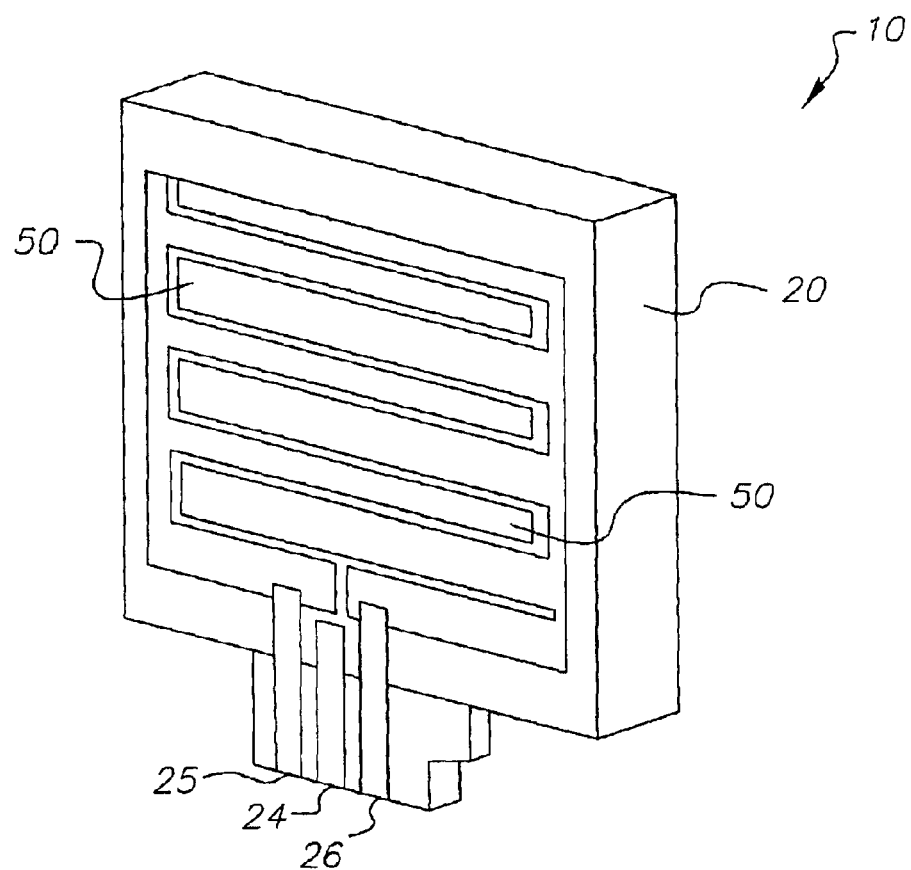
FIG. 3 is a perspective view of a light emitting device having interdigitated light emitting segments according to one embodiment of the invention.

Referring to FIG. 3, in one embodiment of the present invention, the segments are interdigitated. Two segments 50 are shown deposited upon the substrate 20 and having either the cathode 14 or an anode 16 in common. (The roles and position of the cathode and anode may be reversed, as noted above.) The segments 50 are each connected to a common conductor 24 and to separate conductor(s) 25 and 26. The separate conductors are electrically connectable to a power source. Referring back to FIG. 2, each of the conductors is connected to a power control circuit 40 that provides appropriate power to the device. The common conductor may be, for example, a ground or neutral while each of the other conductors may be connected to a controlled power source. The segments are interdigitated to create the appearance of a light emitting area that is continuous over the surface of the illumination device. The number of segments may be chosen to meet the needs of the application, the number of connections available, and the tolerance of the manufacturing process.

The socket 34 may include power control circuit 40 to control the current provided to the different light emitting segments 12. The circuit 40 may also convert the electrical power from the external power source to a form suitable for powering the OLED light source 10. For example, the OLED light source 10 may require a rectified voltage with a particular waveform and magnitude; the power control circuit 40 can provide the particular waveform using conventional power control circuitry. The particular waveform may periodically reverse bias the light emitting organic materials to prolong the lifetime of the OLED materials. The socket 34 may also include a switch 46 for controlling the power to the light source. Preferably, the light source 10 is connected to a standard power source such as 110 or 220 AC or to DC power supplies such as 24, 12, or 6 volts found in vehicles.

The switch 46 can control light levels or colors of light and may include a power control circuit 40. An automatic switch responsive to a variety of stimuli, for example a timer or light sensor may be provided. When the switch is operated, it provides a desired level of power to each of the conductors. The conductors then transfer power to the electrodes and thence to the light emitting layers 12. By modifying the amount of power provided to each of the light emitting layers 12, the brightness of the illumination may be controlled. Different control schemes are possible. For example, the number of segments that are powered can be controlled, the amount of power to all segments may be controlled, or the amount of power applied to any given segment may be controlled. As a simple example, two segments of different size and a three way switch can be employed to provide 3 different light levels.

Alternatively, the segments 50 may be electrically interconnected so that if one of the light emitting segments fails in operation, the other segments will continue to provide light. Hence, the illumination device will exhibit graceful degradation. The power to the remaining segments may also be increased to maintain a constant light level, albeit at the expense of reduced lifetime for the remaining segments.

In an alternative embodiment of the present invention, the light emitting segments may be of different colors. By varying the amount of power provided to each separate segment, the overall color of the illumination may be modified.

Figure 4:
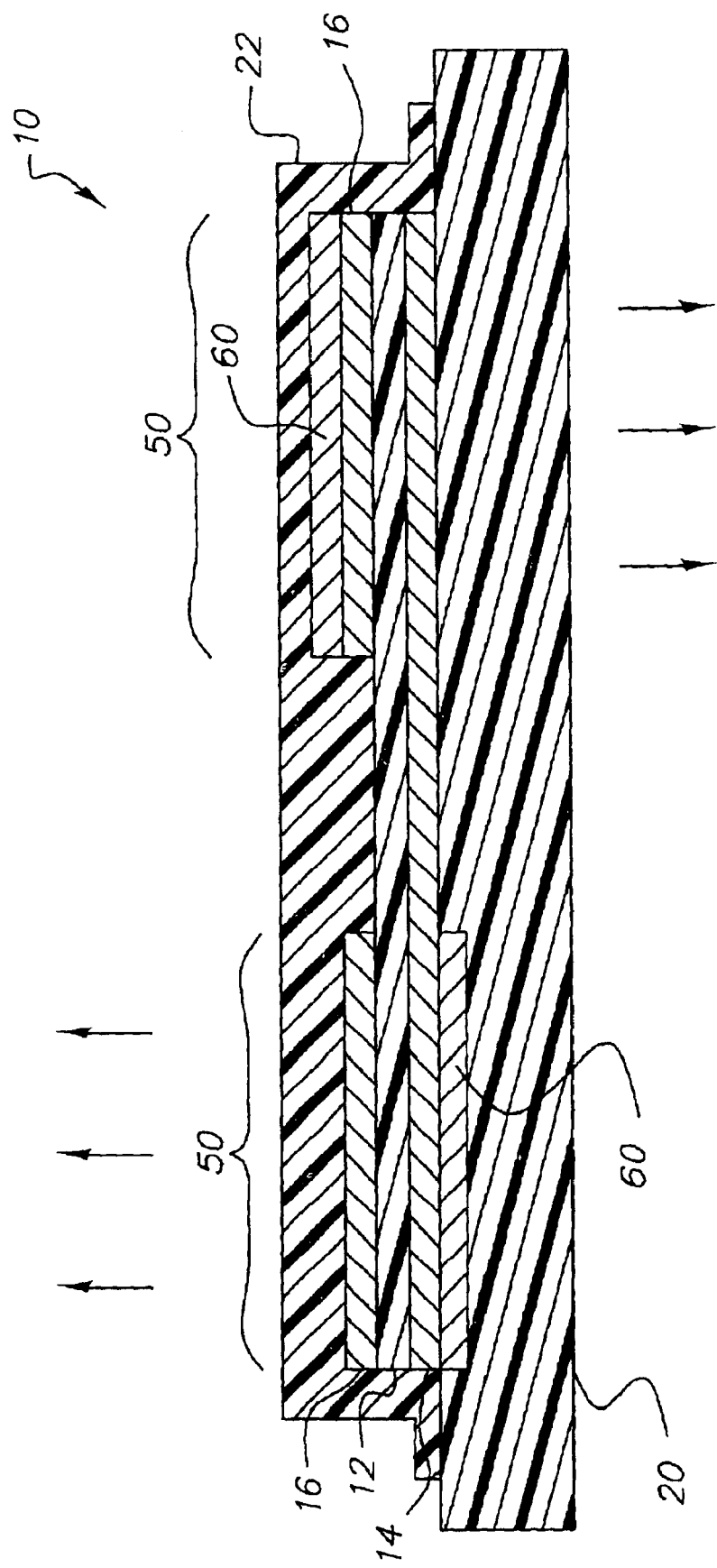
FIG. 4 is a cross-sectional view of a light emitting device having segments that emit light through the cover and the substrate.
Figure 5:
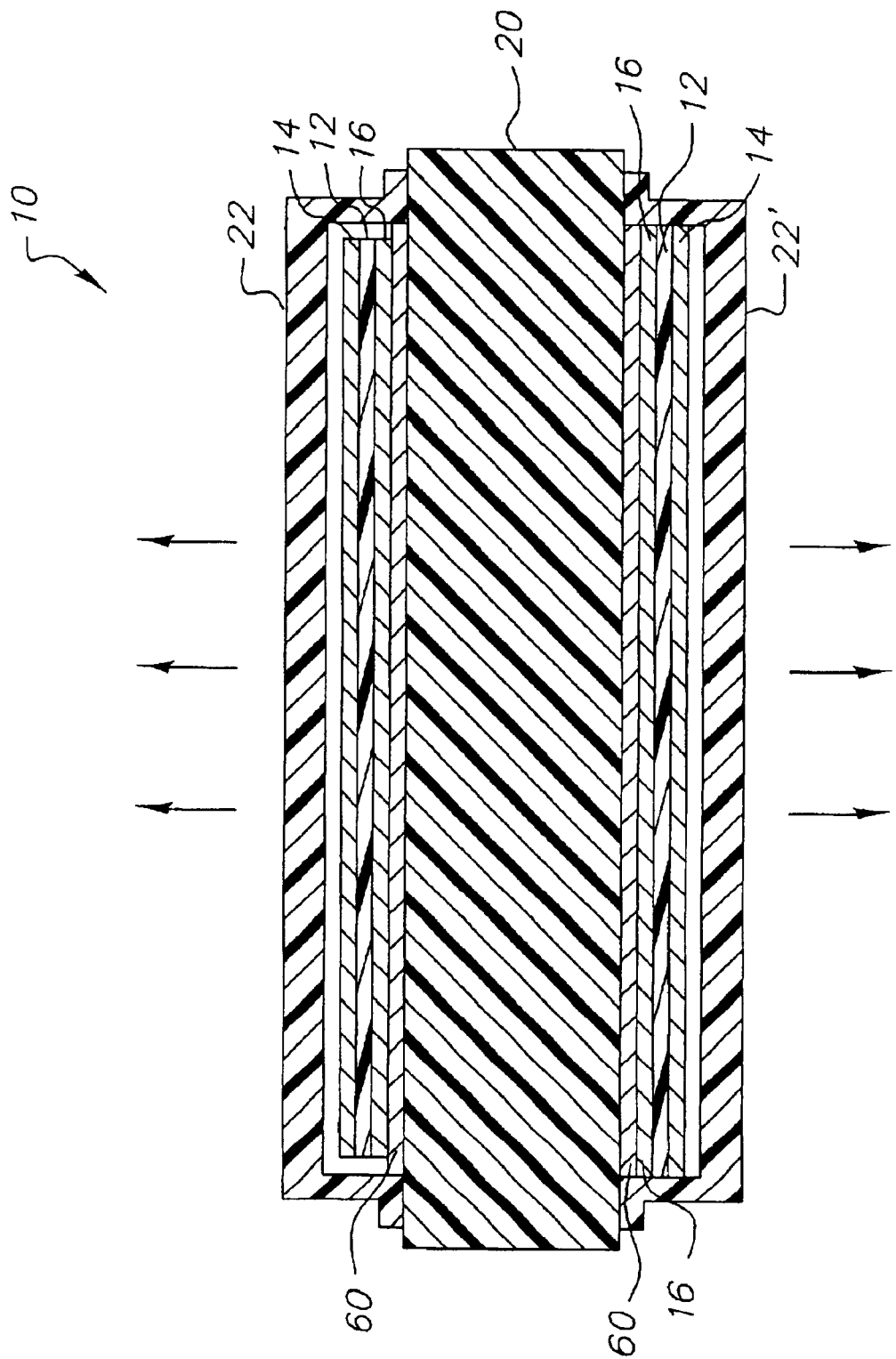
FIG. 5 is a cross-sectional view of a light emitting device having light emitting layers on both sides of a substrate.

Referring to FIG. 4, the light source 10 may emit light from either or both sides. If light is emitted from only one side, one or more reflective layers 60 may be incorporated into the substrate 20 or cover 22 or, alternatively, an electrode 14 or 16 may be reflective rather than transparent. The reflective layers may be incorporated into some or all of the segments on either side of the light emitting layer 12 so that one segment can emit light from one side of the substrate and a second segment can emit light from the other side of the substrate. The directionality of the light source can then be controlled, for example in a floor lamp the light source 10 can be controlled to emit light either up or down, or both. Alternatively, as shown in FIG. 5, a reflective layer 60 may be provided over the entire substrate, and light emitting layers provided on both sides of the substrate and arranged to emit light through transparent encapsulating covers 22 and 22'.

A variety of designs and shapes may be used. Square light sources or, long rectangular light sources may be provided. A single tab for connecting the conductors may be used or multiple tabs and the conductors 24–26 may be provided on the tabs in a variety of arrangements.

Figure 6:
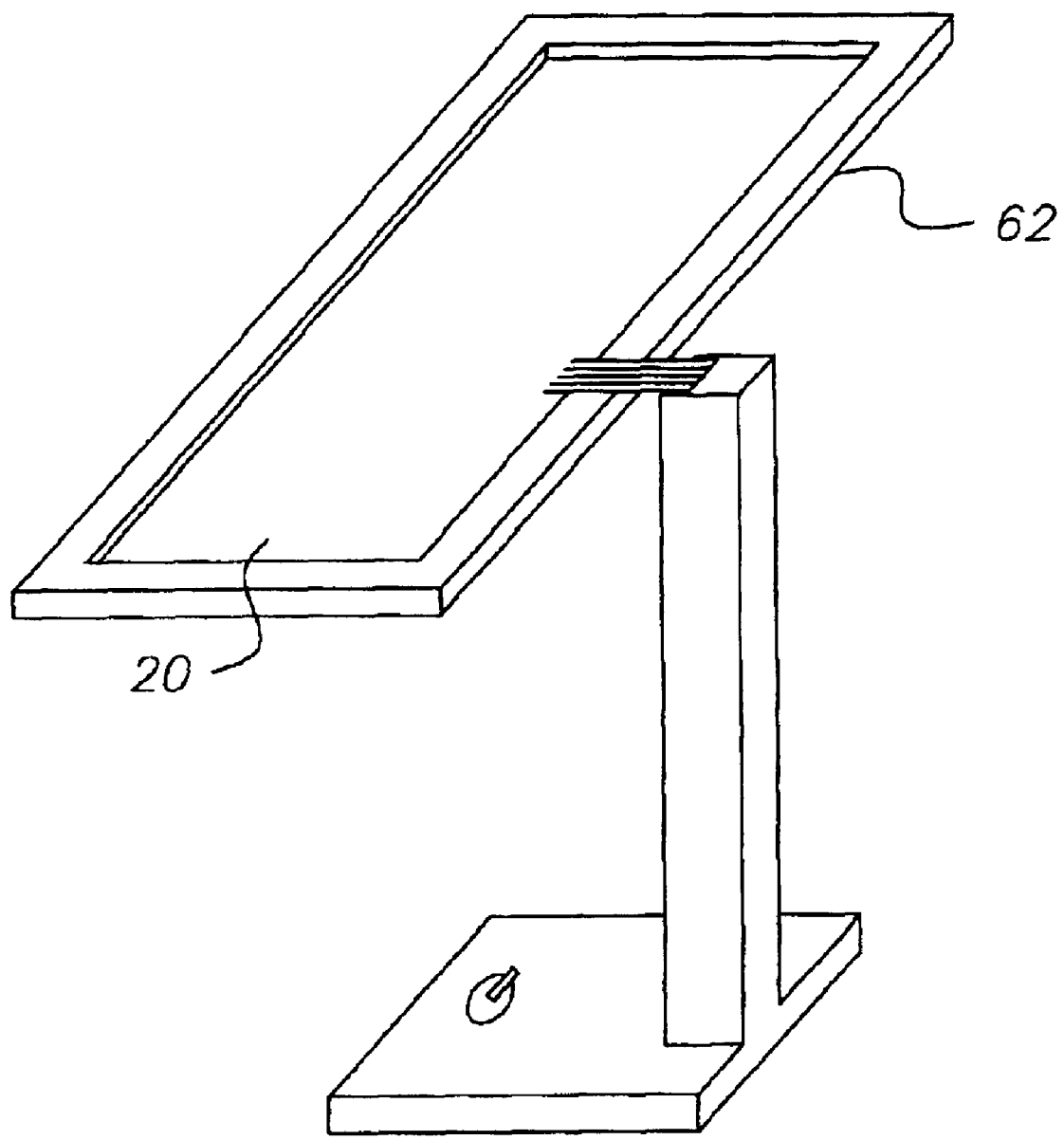
FIG. 6 is a perspective view of a flexible light emitting device held in a frame.

The substrate 20 can be either rigid or flexible. Rigid substrates, such as glass, provide more structural strength and are generally planar but the present invention may also be used with a flexible substrate, such as plastic, that can be bent into a variety of shapes. Referring to FIG. 6, in the case wherein light source 10 is provided with a flexible substrate, a frame 62 may be provided to support and hold the substrate in a desired configuration. A light diffuser may be incorporated into the substrate and or encapsulating cover for example by providing a frosted finish on the substrate or cover, making the substrate or cover from a translucent material, or by adding a layer of diffusely transmitting material.

In a preferred embodiment, the substrate and OLED materials of the OLED light source 10 are manufactured separately from the sockets 34 so that the sockets may be customized to markets with differing power systems. The substrates, in contrast, may be standardized and may be used with any socket to provide advantages of manufacturing and marketing scale. Moreover, substrates with different shapes or other attributes useful in a specific application may be employed with a common socket, thereby decreasing costs and improving usefulness.

The present invention has the added advantage that the light source has a compact planar configuration enabling efficient storage, packing, and shipping.

The present invention may be employed in a wide variety of conventional applications, for example in a table-top lamp, floor-lamp, or chandelier. Alternatively, the invention may be employed as a flat-panel illumination device for a conventional suspended ceiling. The present invention may also be employed in illumination devices using standard AC power sources or in portable illumination devices using DC power sources such as 110 volt AC, 220 volt AC, 24 volt DC, 12 volt DC, and 6 volt DC.

In a preferred embodiment, the invention is employed in an area illumination device that includes an Organic Light Emitting Diode (OLED) which is composed of small molecule or polymeric OLED materials as disclosed in but not limited to U.S. Pat. No. 4,769,292, issued Sep. 6, 1988 to Tang et al., and U.S. Pat. No. 5,061,569, issued Oct. 29, 1991 to VanSlyke et al. The light source may also include multiple light emitting segments as described in commonly assigned U.S. patent application Ser. No. 10/214,035 filed Aug. 7, 2002 by Tyan, and U.S. patent application Ser. No. 10/077,270 filed Feb. 15, 2002 by Liao et al., the disclosures of which are incorporated herein by reference.

The invention has been described in detail with particular reference to certain preferred embodiments thereof, but it will be understood that variations and modifications can be effected within the spirit and scope of the invention.

Parts List

10 OLED light source
12 organic light emitting segment
14 cathode
16 anode
18 power source
20 substrate
20' body portion of substrate
20" tab portion of substrate
22 encapsulating cover
22' encapsulating cover
24 first conductor
25 conductor
26 second conductor
28 step
34 socket
40 power control circuit
46 switch
50 segments
60 reflective layer
62 frame

What is claimed is:

1. A solid state area illumination light source, comprising:
   a) a substrate;
   b) a plurality of non-pixellated organic light emitting diode (OLED) segments deposited on the substrate, each organic light emitting diode segment including a first and a second electrode for providing electrical power to the OLED segment;
   c) an encapsulating cover covering the OLED segments; and
   d) a plurality of conductors located on the substrate and electrically connected to the first and second electrodes, and extending beyond the encapsulating cover for making electrical contact to the first and second electrodes by an external power source.

2. The light source claimed in claim 1, wherein a single set of first and second conductors is connected to the first and second electrodes of the OLED segments in parallel, whereby if one of the OLED segments fail, the others continue to receive electrical power.

3. The light source claimed in claim 1, wherein a plurality of sets of first and second conductors are connected respectively to the first and second electrodes of the OLED segments such that the OLED segments can be individually powered.

4. The light source claimed in claim 3, wherein the OLED segments emit light of the same color, whereby different combinations of the sets of electrodes can be powered to control the brightness of the light source.

5. The light source claimed in claim 3, wherein the OLED segments emit light of different colors, whereby different combinations of the sets of electrodes can be powered to control the color of the light source.

6. The light source claimed in claim 1, wherein the substrate defines a body portion and one or more tab portions; the first and second conductors being located on the tab portion(s).

7. The light source claimed in claim 6, wherein the substrate defines tabs that are located at opposite edges of the substrate.

8. The light source claimed in claim 1, wherein the second electrode is common to all of the segments.

9. The light source claimed in claim 1, wherein the substrate is rigid and planar.

10. The light source claimed in claim 1, wherein the cover is a coated layer.

11. The light source claimed in claim 1, wherein the cover is a hermetically sealed cover plate.

12. The light source claimed in claim 1 wherein the light source operates on standard power.

13. The light source claimed in claim 12, wherein the standard power is elected from the group consisting of 110 volt AC, 220 volt AC, 24 volt DC, 12 volt DC, and 6 volt DC.

14. The light source claimed in claim 1, wherein the substrate is transparent and the light source emits light through the substrate.

15. The light source claimed in claim 14, wherein the transparent substrate includes a light diffuser.

16. The light source claimed in claim 1, wherein the encapsulating cover is transparent and the light source emits light through the encapsulating cover.

17. The light source claimed in claim 16, wherein the transparent cover includes a light diffuser.

18. The light source claimed in claim 1 wherein the substrate is flexible.

19. The light source claimed in claim 18, further comprising a support for holding the flexible substrate in a desired configuration.

20. The light source claimed in claim 1, further comprising a power control circuit connected between the first and second electrical contacts for providing power from the external power source in a form useable by the OLED segments.

21. The light source claimed in claim 1, further comprising a power control circuit connected between the electrical contacts for providing power from the external power source in a form useable by the OLED segments and located in the socket.

22. The light source claimed in claim 21, wherein the power control circuit converts AC line voltage to a voltage useable by the OLED segment.

23. The light source claimed in claim 1, wherein the segments are located on opposite sides of the substrate.

24. The light source claimed in claim 1, further including one or more reflectors for directing light from the segments.

25. The light source claimed in claim 24, wherein the reflectors are arranged to direct light in opposite directions and can be independently powered to direct light in different directions.

26. The light source claimed in claim 1, wherein the segments are of different sizes and can be independently powered to provide a plurality of light levels.

* * * * *